United States Patent [19]

Sawada

[11] Patent Number: 5,725,658

[45] Date of Patent: Mar. 10, 1998

[54] HEAT-TREATMENT METHOD OF GROUPS III–V COMPOUND SEMICONDUCTOR MATERIALS

[75] Inventor: Shin-ichi Sawada, Osaka, Japan

[73] Assignee: Sumitomo Electric Industries, Ltd., Osaka, Japan

[21] Appl. No.: 417,773

[22] Filed: Apr. 6, 1995

[30] Foreign Application Priority Data

Oct. 24, 1994 [JP] Japan ................... 6-284285

[51] Int. Cl.$^6$ ................... C30B 19/10
[52] U.S. Cl. ................... 117/54; 117/56
[58] Field of Search ................... 117/54, 56, 57, 117/61, 81, 82, 83

[56] References Cited

FOREIGN PATENT DOCUMENTS 1242498  3/1988  Japan.
517097   9/1991  Japan.

OTHER PUBLICATIONS

Chemical Abstracts, vol. 113, No. 12, 1990, Sep. 17, Columbus, Ohio, USA Yamamoto M. et al., "Manufacture of compound semiconductor wafers", p. 711.

Chemical Abstracts, vol. 119, No. 6, 1993, Aug. 9, Columbus, Ohio, USA, Inada T. et al., "Manufacture of gallium arsenide single crystal wafer by ion implantation", p. 851.

"Development of High Quality 4–inch Semi–Insulating GaAs Crystal Wafers", M. Kashiwa, et al, Hitachi Cable Review No. 9, p. 55 (Aug., 1990).

Primary Examiner—Felisa Garrett
Attorney, Agent, or Firm—Cushman Darby & Cushman IP Group of Pillsbury Madison & Sutro LLP

[57] ABSTRACT

When a film is formed on a wafer of groups III–V compound semiconductors by heating, slips are formed in the periphery of the wafer because of residual inner stress of the wafer. The quality of an epitaxially grown crystal is damaged by these slips. The residual stress of the wafer is caused by the residual stress generated in an inner part of an ingot at the time of growing a crystal. Therefore, it is an object to prepare a wafer in which no slips are generated when the epitaxial growth is carried out. In order to achieve this object, a method is provided in which; an ingot is heated and cooled in a range between an upper limit temperature $T_h$, and a lower limit temperature $T_1$ where the upper limit temperature ranges from more than 800° C. to less than a melting point of a material of the ingot, and the lower limit temperature ranges from more than 800° C. to less than the upper limit temperature $T_h$. The reciprocating changing between of heating and cooling steps is repeated a plurality of times at a speed A of raising temperature and a speed B of lowering temperature where the speed A of raising temperature is lower than the speed B of lowering temperature. The residual stress is excluded by this heat-treatment method, and, consequently, no slips occur in the peripheral part of a wafer obtained by this invention.

16 Claims, 3 Drawing Sheets

HEAT-TREATMENT METHOD OF GROUPS III-V COMPOUND SEMICONDUCTOR MATERIALS

FIELD OF THE INVENTION

This invention relates to a heat-treatment method for reducing residual inner stress of groups III–V compound semiconductor materials, for example, GaAs, InP, and so on, and more particularly relates to an ingot annealing method of groups III–V compound semiconductor crystals. Single crystals of groups III–V compound semiconductor materials are produced by the LEC (Liquid Encapsulating Czockralski) method or the HB (Horizontal Bridgman) method. Wafers are made by slicing a single ingot off. Various kinds of semiconductor films are able to be formed on a wafer by and epitaxial growth. The wafers have a great variety of utilities as substrates of semiconductor devices. Hence, various properties are required for the substrates in accordance with their intended applications. To satisfy these requirements, compound semiconductor materials are sometimes dealt with by annealing in the step of ingots or wafers of the compound semiconductor materials.

BACKGROUND OF THE INVENTION

This invention claims the priority of Japanese Patent Application No. 6-284285 (JP-A-6-284285) filed Oct. 24, 1994, which is incorporated herein by reference.

Heat treatment of groups III–V compound semiconductors has been mainly practiced for the purpose of improving electrical properties. When a wafer is, for example, used as an FET (Field-Effect Transistor) substrate, it is a serious drawback that threshold values of switching fluctuate on a surface of the wafer. Such a fluctuation of the threshold values is caused by the fluctuation of electrical properties of the substrate. Many methods for solving the above disadvantage have been proposed.

[1] Laid open patent application No. 1-242498 (242498/1989) Laid open date: Sep. 27, 1989, Title of the invention: "HEAT-TREATMENT METHOD OF A GALLIUM ARSENIDE (GaAs) SINGLE CRYSTAL".

The above-described application proposes a heat treatment of an In-doped GaAs ingot which had been grown by the LEC (Liquid Encapsulating Czockralski) method and then had been once cooled. An ingot just as it is or wafers were heated and kept at a high temperature $T_1$ ranging from 1050° C. to 1200° C. Moreover, the ingot or the wafers were rapidly cooled and kept at a temperature $T_2$ ranging from 750° to 950° C. Then the ingot or the wafers were rapidly cooled again to room temperature.

The application proposes the heat treatment consist of two steps, i.e. maintenance at the temperature $T_1$—rapid cooling—maintenance at the temperature $T_2$—rapid cooling. It is reported that there existed fine defects even in In-doped, dislocation-free GaAs crystals, and thereby electrical properties were disturbed. Such fine defects can be observed on a GaAs crystal surface etched with molten KOH by the infrared scattering method. It was assumed that these fine defects would be caused not by the crystal dislocation but by the segregation of As. The heat treatment disclosed by the invention [1] was practiced so as to exclude the fine defects and raise the insulation of the substrate. The application states that the fine defects did not appear, if the cooling after the growth of the ingot was so rapid. The excess As was converted into liquid at the temperature $T_1$, whereby fine defects were broken down. Hence, such a rapid cooling prevents As from re-condensation, and further, helps As to be distributed uniformly and to be solidified. The treatment at temperature $T_2$ was introduced in order to heighten the insulation of the substrate. The insulating ability of the entire crystal was raised and the fluctuation of resistivity became small by the heat-treatment at temperature $T_2$. The heat-treatments carried out at the temperatures $T_1$ and $T_2$ were static, because the crystal was only kept at a constant temperature for a long time, for example, about two hours.

[2] M. Kashiwa, Y. Otoki, M. Seki, S. Taharasako & S. Okubo, "Development of high quality 4-inch semi-insulating GaAs crystal wafers", Hitachi Cable Review No. 9, p55 (August 1990)

This document points out that fine defects were generated by the segregation of As of a GaAs crystal, as well as the application [1]. Further, the document aims at generating EL2-levels. It reports that all the conventional heat-treatments had been single step heat-treatments in which a crystal was heated up to a temperature of from 800° to 1000° C. This single step heat-treatment had been likely to be effective for excluding As precipitate, and had been effective only for removing the fluctuation of macroscopic property, i.e. fine defects. The document states there still existed the fluctuation of microscopic property which had never been removed by the prior single step heat-treatment. Such a fluctuation of the microscopic property could be revealed by measuring the photoluminescence or the infrared scattering light. The document insists that it should be rather appropriate to make the defects such as EL2-levels positively in uniform distribution in order to produce an semi-insulating substrate with high resistance. The document asserts that the resistance was heightened by improving the electrical property. Resistance was fixed at a high value by the EL2-levels, and was not lowered by the following heating.

The document [2] proposes a three-step heat-treatment. A sample was dealt with by the three-step heating treatment wherein the sample was kept at a temperature $T_1$ more than 1100° C. for several hours, was treated at another temperature $T_2$ ranging from 500° C. to 600° C. for several hours, and was maintained at another temperature $T_3$ ranging from 800° C. to 1000° C. for several hours. As precipitate was dissolved at the temperature $T_1$, the dissolved As spread into the crystal. The crystal was rapidly cooled at the transition from the temperature $T_1$ to the temperature $T_2$, and formed finer precipitates at the temperature $T_3$. These fine precipitates became mother nuclei of EL2-levels. Hence, the heat-treatment at the temperature $T_2$ was practiced for generating nuclei. When the crystal was heated up to the temperature $T_3$, a lot of EL2-levels were grown from the nuclei, whereby the resistance of the crystal was increased to be a semi-insulating substrate. The microscopic property is equalized in the whole wafer due to the uniform generation of EL2-levels. The physical values measured by the photoluminescence or the infrared scattering were averaged in the crystal.

[3] A heat-treatment method is disclosed in Laid Open Patent Application No. 5-117097 (Laid Open Date: May 14, 1993), which deals with a GaAs crystal by the heat-treatment having the steps of repeatedly raising and lowering temperature in the range of from 1100° C. to 1230° C., and maintaining the GaAs crystal at a temperature ranging from 800° C. to 1000° C. for eliminating the thermal distortion of the crystal. This method may be called "two-step heat-treatment".

In this method, however, the heating rate was the same as the cooling rate, i.e. a definite rate from 120° C./H to 600° C./H which was comparatively high. The document states that such repetitions of cooling and heating were practiced not only for eliminating the thermal distortion from the crystal but also for making the EL2-levels disperse uniformly. The Inventors of the present invention, however, think that dislocations in the GaAs crystal would be increased by repeating the rapid heating and cooling. Further, it is hardly assumed that such a thermal distortion could be eliminated by the monotonous repetitions of symmetric cooling and heating. It is necessary to consider much more with regard to the exchange of the heat distribution and the stress distribution in the GaAs crystal by the heat-treatment.

Objects of the present invention differ from that of the prior documents. Groups III-V compound semiconductor wafers, such as GaAs, InP, etc. are used for substrates on which films are epitaxially grown in order to make various devices. MOCVD (OMVPE), MBE, and so on are used as epitaxial growth methods. A wafer (as a substrate) is heated to a temperature of about hundreds of celsius degrees. When the wafer has residual inner stress at the periphery of the wafer, slips are generated at the periphery of the wafer. These are lattice defects brought about by slipping the lattice structure in a certain direction in the crystal. The lattices in the crystal are relatively easy to move by heating, and thereby dislocations occur in the crystal, and the inner stress in the crystal is released. Newly generated slips lower the quality of an epitaxially grown film, because the epitaxially grown film is greatly influenced by the crystal structure of the substrate. If the wafer were not heated, no slips would occur. However, the wafer must be heated for the epitaxial treatment. Therefore, there is no other means for suppressing the occurrence of slips but to remove the residual stress therein for suppressing the occurrence of slips. A large, heavy single crystal ingot is cut into slices as wafers by a slicer. There are a lot of methods to produce an ingot of a single crystal. In the case of producing groups III-V compound semiconductors, the vapor pressure of group V elements is so high that many improvements are provided in order to prevent group V elements from dissociating. For example, in the LEC (Liquid Encapsulating Czockralski) method, a pressure vessel is furnished with a crucible, heaters, an upper shaft, a lower shaft and so on. A solid material and a liquid-encapsulating material are put in the crucible. The pressure vessel is sealed, and the materials are melted by the heaters. A seed crystal positioned at an end of the upper shaft is dipped into a melt in which the materials have been melted, and is pulled up from the melt. In the HB (Horizontal Bridgman) method, a solid material is put into a boat which is long in length, the boat is placed in a long quartz tube, and the long quartz tube is sealed. The solid material is melted in a chamber having a temperature gradient. After that, the solution is solidified from an end of the boat. A single crystal is grown by the steps of putting a solid material in a vessel, melting the solid material into a melt by heating, and solidifying the material melt gradually in every method. After the grown crystal is cooled, the crystal is removed from the vessel. The temperature distribution during the making of the crystal is different from the temperature distribution during the cooling of the crystal, so that inner stresses in various directions remain at various parts in the crystal. Accordingly, as the size of crystal becomes large, these stresses become greater.

It is known that a single crystal ingot has a strong residual stress, and further slips are induced by the residual stress. It is, however, unclear what directions of the residual stress would occur in the crystal, or what parts of the crystal would incur the residual stress. Further, it is not exactly recognized how large the residual stresses are. Consequently, to a method of excluding such various residual stresses has never been known. It may be assumed that impurities should be doped into a crystal in order to form a strong lattice structure, because the strong lattice structure would prevent the crystal from generating slips. Such impurity doping, however, influences electrical properties, so that it is not always employed for eliminating slips. It is desirable to provide a heat-treatment method which does not change electrical properties.

OBJECTS AND SUMMARY OF THE INVENTION

It is an object of the present invention to improve the property of and in particular to prevent the generation of slips that are caused by the heat supplied when a crystal is epitaxially grown on a wafer sliced from the ingot.

A further object of the present invention is to provide a method for preventing a crystal from generating slips, and thereby prevent the degradation of the electrical properties of the crystal.

A still further object of the present invention is to provide a heat-treatment method capable of effectively eliminating residual stress of compound semiconductor crystals.

This invention proposes a heat-treatment method of changing the temperature of a crystal up and down by repeating the process of cooling and heating a crystal ingot of groups III-V compound semiconductors alternately in a temperature region from "$T_1$" more than 800° C. ($T_0$) to "$T_h$" less than a melting point $T_m$ of the crystal, where the highest temperature is denoted by "$T_h$", the lowest temperature is denoted by "$T_1$", and the range therebetween is denoted by "$T_h - T_1$". In this case, ascending speed A is lower than descending speed B. The highest temperature $T_h$ and the lowest temperature $T_1$ are surely included in the range between $T_0$ and $T_m$. Repeating number n of heating and cooling the sample is defined to be more than two, i.e. n>2.

The heat-treatment of the present invention differs from conventional heat-treatments in objects and techniques. In particular, the technique of this heat-treatment is absolutely different from that of conventional heat-treatments. Generally, prior heat-treatment means a treatment of maintaining a sample at an optimum temperature for a certain time. Therefore, the temperature of the sample is not changed during the heat-treatment. It is said that such conventional heat-treatment has a static characteristic. By contrast, the heat-treatment of this invention has an extremely dynamic characteristic, because the process for raising and lowering temperature is repeated many times.

In this heat-treatment method, a sample, which has been produced as a single crystal ingot, and has been once cooled, can be treated. In this case, the sample is heated from room temperature up to a temperature $T_h$ ranging from $T_0$ (800° C.) to $T_m$. After this initial heating, a zigzag heat-treatment which comprises repeating heating and cooling alternately is carried out.

It is feasible that this heat-treatment is also applied to a hot crystal which has just been grown in a crystal growth chamber. In this case, there is no process for heating the crystal from room temperature. A crystal produced by the LEC method is supported by an upper shaft at a certain height, and the temperature of the crystal is changed up and down in a range of from $T_h$ to $T_1$ by controlling the power of the heaters. Otherwise, it is further possible to change the crystal temperature effectively by raising or lowering the upper shaft in the temperature gradient formed by the heaters installed in the chamber.

There is no problem of contamination when a just grown single crystal is continually annealed by the heat-treatment. Further, curtailing the total energy consumption is effective therein. It takes the apparatus a long time to finishing the heat-treatment, so that the throughput of the apparatus for producing a single crystal is decreased. Since this heat-treatment can be practiced by both methods, a more suitable method should be selected on a case by case basis, with consideration being given to the object and the economy.

The method of this heat-treatment will be explained by referring to FIG. 1 and FIG. 2. A sectional shape of an object ingot is arbitrary, for example, a circular section, a rectangular section, a half-circular section, and so on. Here, FIG. 2 shows an ingot 10 of a compound semiconductor single crystal, which is shaped like a column having a diameter D and a length L. This ingot will be dealt with by the heat-treatment of the present invention. The ingot is sealed in a quartz tube 12, as shown in FIG. 2. The quartz tube is put into a furnace. The temperature of the furnace is raised at the rate of E° C./H (hour), which starts from time $t_0$. The temperature of the furnace reaches its upper limit temperature $T_h$ at $t_1$. The ingot is not kept at the upper limit temperature $T_h$. Further, the temperature of the furnace is immediately lowered at the rate of B° C./H, and reaches the predetermined lower limit temperature $T_1$ at $t_2$. The ingot is, however, not maintained at the lower limit temperature. On the contrary, the chamber temperature is raised at the rate of A° C./H. The chamber temperature reaches the upper limit temperature $T_h$ at $t_3$. Next, the chamber temperature is lowered again at the rate of B° C./H, and comes to reach the lower limit temperature $T_1$ at $t_4$. In the next step, the chamber temperature is raised at the rate of A° C./H, and comes to reach the upper limit temperature $T_h$ at $t_5$. Further, the temperature is lowered at the rate of B° C./H. After that, the same procedure is repeated a plurality of times. When the temperature has attained the upper limit temperature $T_h$ at $t_{2n-1}$ in the last cycle, the temperature of the sample is monotonously lowered at the rate of F° C./H, and the sample is finally cooled to room temperature at $t_{2n}$. Repetition number of the descent and ascent of the temperature is n times. The sample is removed from the quartz tube. Then, the ingot is cut into slices, and the slices are processed to be wafers.

The heat-treatment of this invention gives a plurality of reciprocating changes to the sample temperature in a range from $T_h$ to $T_1$. This is a dynamic heat-treatment method which oscillates the sample temperature. FIG. 1 is a temperature diagram, wherein a sample is initially heated at room temperature, is repeatedly processed by the heat-treatment, in which cooling and heating are alternately repeated a plurality of times, and at last is cooled down to room temperature.

Furthermore, it is feasible to anneal a crystal being just grown in a crystal growth chamber by this heat-treatment method. Further, it is possible to change $T_h$ and $T_1$ as a function of time within a range satisfying $T_m \geq T_h > T_1 \geq 800°$ C.

The reasons why this repeating heat-treatment method can reduce the residual stress generated in a crystal will be explained hereafter. Crystals, e.g. GaAs, InP, etc., as mentioned before, are made by the LEC method. The crystals made by each of the methods differ from each other in dislocation density and applications. The crystals are sliced into wafers and films; however, the crystals are grown on the wafers as substrates by the epitaxial growing method. The wafers made by other methods are also utilized for growing films epitaxially thereon. The temperatures are generally different between a middle part and an outer part of a crystal during the growth. The coordinate Z is taken in an axial direction. There exists a difference between the outer-part temperature W and the inner-part temperature Q at the same coordinate Z, which brings about the stresses caused by the difference of thermal expansion therebetween. Hence, the dislocations are generated in the crystal, and the crystal suffers plastic deformation. If the plastic-deformed crystal is cooled and kept at room temperature, the relationship of stresses between the outer part and the inner part of the crystal is changed, which is contrary to the relationship of stresses therebetween during the growing of a crystal.

Next, a more detailed explanation about why this heat-treatment is suitable for decreasing the residual stress should be described by citing a crystal being produced by the LEC method as an example. The sample crystal has a rotational symmetry and a diameter of R. This crystal is suitable for clarifying the mechanisms of the heat-treatment of the present invention, because the crystal is excellent in symmetry.

Two points, that is, an outer point and an inner point having the same coordinate Z, are assumed in the crystal. When the crystal has just been drawn from a melt in a crucible, the temperature W of a point $(R, Z, \phi)$ taken at the periphery of the crystal is higher than the temperature Q of the central point $(0, Z, \phi)$ of the crystal. This coordinate system is a cylindrical one. Thus the solid- liquid interface is convex downward. As mentioned above, since the temperature of the periphery is higher than that of the center, i.e. W>Q, compressive stress occurs in the circumferential direction at the point $(R, Z, \phi)$, but tensile stress occurs in the circumferential direction at the point $(0, Z, \phi)$. The peripheral part of the crystal is relatively apt to expand, and the center part of the crystal is relatively apt to contract. Therefore, the peripheral part is influenced by the center part that intends to shrink, and suffers the compressive stress from the center part. The center part is affected by the peripheral part that intends to expand, and suffers the tensile stress from the peripheral part. However, the temperature of the crystal that has just been drawn is so high that the dislocations are increased in the crystal, and thereby the stress is modified. Hence, the crystal is plastic-deformed so as to reduce the difference of the stresses between the peripheral part and the center part. This mechanism brings about the modification of the stresses.

When the crystal is cooled and kept at room temperature, the temperature of the center part becomes the same as that of the peripheral part, i.e. W=Q. It may be supposed that the stress might have disappeared; however, the stresses have not disappeared. Rather the stresses have been modified by the increase of the dislocations, and the crystal has been plastic-deformed at the high temperature so as to reduce the difference of stresses between the peripheral part and the center part. When the temperature is lowered to room temperature, the stresses are overcompensated by the plastic-deformation yielded at the high temperature. The fact means that the relationship of stresses between the peripheral part and the center part is reversed, that is, the tensile stress occurs at the peripheral part, and the compressive stress occurs at the center part. A strong tensile stress at the peripheral part becomes a cause of slips that are generated in a film epitaxially grown on a wafer of the crystal.

When a film is epitaxially grown on a wafer as a substrate, the substrate must be heated, so that atoms forming a lattice structure are easy to move. In the case of a wafer, as the temperature of the wafer is rising, the tensional relation between the tensile stress of the peripheral part and the compressive stress of the center part, is maintained even if both parts are always heated to the same temperature at the same speed. The movements of the lattices, therefore, are activated, and the dislocations are easy to move, which induces the generation of slips.

If a compressive stress exists in the circumferential direction at the center part, there exists a tensile stress in the circumferential direction at the peripheral part in order to maintain the complementary relation therebetween. Tensile stresses and compressive stresses correspond to two parts and two temperatures W and Q which vary in the heat-treatment. It is difficult to understand the mechanism intuitively because of a lot of variables. Independent variables, however, are actually few. Here, only the following two variables should be considered for an intuitive understanding. One variable is the difference $\Delta T$ between the temperatures W at the periphery and Q at the center. The other variable is the compressive stress $\sigma$ in the circumferential direction at the peripheral part. $\sigma$ is defined to be positive when the tensile stress in the circumferential direction occurs in the peripheral part and the compressive stress in the circumferential direction occurs in the center part. $\Delta T$ is a variable designating the difference (W−Q) neglecting the condition whether both the temperatures W and Q are high or low. It is unnecessary to consider the absolute values of the temperatures W and Q at the peripheral part and the center part. Only the difference therebetween should be an important factor to be considered.

As explained hitherto, when a crystal is grown, $\Delta T$ is positive, so that the periphery of the crystal incurs compressive stress. Hence, when $\Delta T$ is positive, the compressive stress $\sigma$ is also positive. If $\Delta T$ were simply proportional to $\sigma$, the compressive stress $\sigma$ should also be zero when $\Delta T$ is zero, i.e. $\Delta T=0$. However, it is not correct. If $\Delta T$ becomes greater, $\sigma$ is saturated. This is the modification of the stress. Such a stress modification is, in particular, apt to occur at high temperature.

FIG. 5 shows a stress-temperature chart showing the relationship between the compressive stress ($\sigma$) at the periphery, and the difference ($\Delta T$) of the temperatures between the peripheral part (Tp) and the center part (Tc) of a crystal. Then $\Delta T=Tp-Tc$. The abscissa shows $\Delta T$ and the ordinate shows the stress at the periphery, where the ordinate higher than the origin shows the compressive stress, and the ordinate lower than the origin shows the tensile stress. When a solid is made from material melt in a chamber for growing a crystal, $\Delta T$ is positive. Point (i) is a starting point of the crystal growth. The periphery of the crystal incurs compressive stress, but the compressive stress is so small due to the modification of the stress. The solid, i.e. the crystal is cooled in the chamber after the growth (a) of the crystal. Point (b) shows the situation where $\Delta T$ is positive but the stress therebetween is zero in the meantime of cooling. The situation shown by point (b) is brought about by the modification of stress at point (a). Further, when the difference of temperature $\Delta T$ is decreased, and the crystal has completely been cooled to room temperature, $\Delta T$ is zero, i.e. $\Delta T=0$. In this situation, a strong tensile stress exists at the peripheral part of the crystal, as explained above. Point (c) shows that situation.

The heat-treatment of this invention starts from point (c) at time to in FIG. 1 which is a graph showing also the relationship between temperatures and times. Since the heating starts from point (c) at $t_0$, $\Delta T$ becomes positive (which means that the periphery is higher than the center in temperature). The crystal is heated up to the upper limit temperature $T_h$ at $t_1$ in FIG. 1. The temperature is raised for a period of from t to $t_1$, so that $\Delta T$ is positive and nearly constant. The first right turning point ($t_0 \sim t_1$) is only a point in FIG. 5 but is corresponds to the considerably long time interval between $t_0$ and $t_1$ in FIG. 1. In the meantime, $\Delta T$ is constant, although the surface temperature Tp varied from $T_1$ to $T_h$, because the center temperature varies from ($T_1-\Delta T$) to ($T_h-\Delta T$).

Therefore, the tensile stress is decreased, and the compressive stress is increased, but compressive stress ran not surpass because of large residual tensile stress. On the contrary, since the temperature is reduced during a period of from $t_1$ to $t_2$, $\Delta T$ becomes negative. The left second turning point ($t_1 \sim t_2$) is only a small region in FIG. 5 but corresponds a long interval from $t_1$ to $t_2$ in which the temperature Tp falls from $T_h$ to $t_1$. The transition from the first right turning point ($t_0 \sim t_1$) to the second left tuning point ($t_1 \sim t_2$) at a moment of $t_1$. Therefore, the tensile stress is heighten at a sudden in the rapid transition. The change of the stress is rather meaningless. The tensile stress is reduced in a considerably long period of from $t_1$ to $t_2$, since the residual tensile stress is released.

The stress curve in FIG. 5 is slightly moved upward to the compressive stress side in the meantime of $t_1 \sim t_2$. This increase of the compressive stress is important. Then the curve rapidly changes from point ($t_1 \sim t_2$) to the right second turning point ($t_2 \sim t_3$) at a moment of $t_2$. The tensile stress decreases to a great extent, but this decrease is not important. $\Delta T$ is positive ($\Delta T_A$) in a period ($t_2 \sim t_3$) which is a second rise of the temperature. But the increase of tensile stress is small because of the small temperature difference $\Delta T_A$.

Then a rapid transition occurs at a moment at $t_3$. The tensile stress is increased in the transition. The increase, however, is insignificant. The second left turning point ($t_3 \sim t_4$) induces a permanent increase of the compressive stress by the big negative $\Delta T_B$. The stress curve slightly moved upward in the period of $t_3 \sim t_4$.

Similar heat-treatment cycles are repeated, that is, the heat-treatment, which repeats the ascent ($t_0 \sim t_1$, $t_2 \sim t_3$, $t_4 \sim t_5$, $\ldots t_{2n-2} \sim t_{2n-1}$) and the descent ($t_1 \sim t_2$, $t_3 \sim t_4$, $t_5 \sim t_6$, $\ldots$, $t_{2n-1} \sim t_{2n}$) of the temperature alternately. The increase (W) of the compressive stress in the descents is bigger than the decease (U) of the compressive stress in the ascents. Thus, a heating cycle reduces the tensile stress by the difference (W−U). As the heat-treatment is repeated, the tensile stress gradually becomes smaller.

Since the failing speed B is larger than the rising speed A, i.e. B>A, $|\Delta T_B|>\Delta T_A$. The quantity (W) of reducing the tensile stress by $\Delta T_B$ ($t_1 \sim t_2$, $t_3 \sim t_4$, $t_5 \sim t_6$, $\ldots$, $t_{2n-1} \sim t_{2n}$) becomes larger than the quantity (U) of increasing the tensile stress by $\Delta T_A$ ($t_0 \sim t_1$, $t_2 \sim t_3$, $t_4 \sim t_5$, $\ldots$, $t_{2n-2} \sim t_{2n-1}$). As a whole, the residual tensile stress becomes smaller.

At point (d), the temperature is reduced to room temperature. $\Delta T$ is zero at point (d). The stress is approaching to zero, but a little compressive stress or tensile stress may remain. The absolute value of the stress is decreased as compared with point (c). It is suitable for practicing these cycles to practice at a temperature more than 800° C., because the movement of dislocations becomes more active, and the residual tensile stress is easily released thereby. Further, cracks would incur sometimes, if the crystal is cooled at a temperature less than 800° C.

Almost all the amounts of residual stress which has existed in a crystal is nearly eliminated from an ingot of groups III–V compound semiconductors by utilizing the heat-treatment of this invention. Dynamic heat-treatment of this invention is effective for releasing the inner stresses between an inside and an outside of the crystal. Slips hardly occur in an epitaxial film which is grown on a wafer as a substrate which is made by slicing an ingot dealt with by this heat-treatment. Epitaxial layers suffer no damages, so that epitaxial wafers of good quality can be produced.

BRIEF DESCRIPTION OF THE DRAWINGS

FIG. 1 is a graph showing the temporal change of the temperature of a crystal in the heat-treatment of this invention.

FIG. 2 is a perspective view showing an ingot sealed in a quartz tube prepared for the heat-treatment of this invention.

DETAILED DESCRIPTION OF THE PREFERRED EMBODIMENTS

[Embodiment 1]

Figure 5:
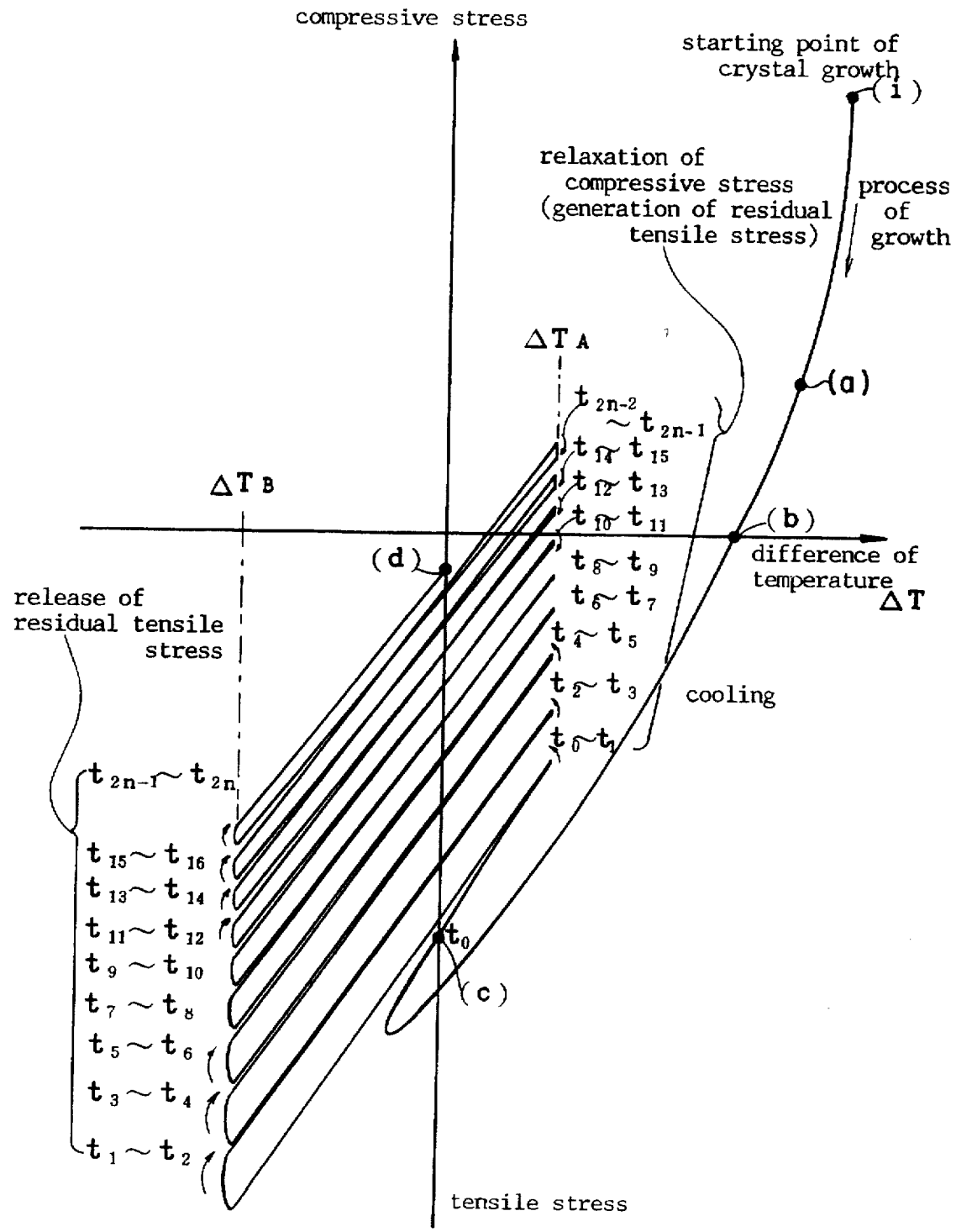
FIG. 5 is a graph for explaining the fundamentals of the heat-treatment of this invention where the difference of temperature $\Delta T$ is denoted by the abscissa, compressive stress is denoted by the ordinate higher than the origin, and tensile stress is denoted by the ordinate lower than the origin.

A cylindrical GaAs single crystal ingot, that had a diameter of 100 mm$\phi$ and a length of 200 mm, was sealed in a quartz tube. Heat-treatment, as shown in FIG. 1, was practiced after the quartz tube had been put into a chamber. Speed E of raising temperature in the early stages was 40° C./H, i.e. E=40° C./H. The upper limit of temperature $T_h$ of the heat-treatment was 1100° C., i.e. $T_h$=1100° C. The lower limit of temperature $T_1$ was 1000° C., i.e. $T_1$=1000° C. Speed A of raising temperature in a period where the temperature of the crystal was repeatedly heighten and lowered was 30° C./H, i.e. A=30° C./H. Speed B of lowering temperature in the same period was 100° C./H, i.e. B=100° C./H. The final speed F of lowering temperature after the heat-treatment was 100° C./H, i.e. F=100° C./H. A repetition number n of the ascent and descent of temperature was 5, i.e. n=5. The amplitude of the ascent and descent of temperature in the heat-treatment was 100° C. A unit time of lowering temperature during a period from $t_{2m-1}$ to $t_{2m}$ was one hour (1 H). A unit time of raising temperature during a period from $t_{2m}$ to $t_{2m+1}$ was 3H20M (3 hours and 20 minutes). One cycle of the heat-treatment took 4 hours and 20 minutes. The first stage of raising temperature to $T_1$ required 25 hours. Five heat-treatment cycles needed 21 hours and 40 minutes. The last descent of temperature from $T_1$ required 10 hours.

An average residual strain |sr−s0| of the ingot of the pre-heat-treatment was $3\times10^{-5}$ to $5\times10^{-5}$. When a film was epitaxially grown on a wafer which was made by slicing the ingot of the pre-heat-treatment, the film suffered a lot of slips. An average residual strain (deformation) of the ingot of the post-heat-treatment was decreased to $0.5\times10^{-5}$ to $0.8\times10^{-5}$. Therefore, the residual strain after the heat-treatment was reduced to about one-third to one-tenth of the residual strain before the heat-treatment. When a film was epitaxially grown on a wafer which was made by slicing the ingot dealt with by the heat-treatment, no slips were found out. An epitaxially formed film of good quality could be obtained by the heat-treatment of this invention.

[Comparison Example 1]

A GaAs ingot having the same sizes as Embodiment 1 was dealt with by the heat-treated under the same conditions. Repetition number was 1, i.e. n=1, which means that an opportunity to reach the upper limit temperature $T_h$ is only one. The residual strain therein was reduced to $2\sim3\times10^{-5}$, which was approximately a half of the residual strain of the starting ingot. This is, however, insufficient. When a compound semiconductor film was epitaxially grown on a wafer which was made by slicing the ingot produced thereby, slips occurred. If the repetition number is more than 2, i.e. n>2, it is effective to depress the generation of slips.

[Comparison Example 2]

The lower limit temperatures $T_1$ of all the samples were fixed at a temperature less than 800° C. The upper limit temperatures $T_h$ of the samples were fixed at a temperature either less than 800° C. or more than 800° C. The repetition numbers n of all the examples were more than 2, i.e. n>2. The result is insufficient, even if A<B is established. The ingot itself incurs cracks, and more particularly a sufficient residual strain can not be reduced when the upper limit temperature $T_h$ is less than 800° C., i.e. $T_h$<800° C. This fact indicates that a GaAs ingot must be processed by the heat-treatment having $T_h$ and $T_1$ being more than 800° C.

[Comparison Example 3]

When the descent of temperature and the ascent of temperature are repeated in the present invention, there exists the requirement that the speed of raising temperature A is lower than that of lowering temperature B, i.e. A<B. By contrast, another heat-treatment satisfying the requirement A>B were investigated. The speed A of raising temperature was 100° C./H, and the speed B of lowering temperature was 30° C./H. Other parameters were the same as Embodiment [1]. An average residual strain ranged from $4\times10^{-5}$ to $6\times10^{-5}$. As known from this result, the residual strain was, on the contrary, increased. It becomes clear that the heating-speed A should be lower and the cooling-speed B should be higher. Hence, it is apparent that the requirement of A<B is an important factor to establish an effective heat-treatment.

[Embodiment 2]

The Inventors of the present invention adopted GaAs crystals as samples, and investigated the upper limit and the lower limit of both the speed A of raising temperature and the speed B of lowering temperature for samples having various dislocation densities and different diameters. When GaAs crystals had impurity concentrations less than $10^{18}$ cm$^{-3}$, boundary speed C can be defined. This boundary speed C is the speed of an absolute border between the speeds A and B, which satisfies the requirement A<C<B. It is discovered that the absolute boundary speed can be expressed by C=4600/D$^2$ (° C./H), where a diameter D (cm) of each crystal is denoted by the unit of cm (centimeter). When D=10 cm, for example, an absolute boundary speed C is 46° C./H, that is, A<46° C./H<B. When films were epitaxially grown on wafers as the samples which were dealt with by the heat-treatment in the condition of A<46° C.<B, no slips occurred therein. When samples are not shaped like columns, an effective diameter D can be calculated from a sectional area S, that is, D is obtained by substituting S into the equation $D=(4S/\pi)^{1/2}$. When crystals have ordinary sectional shapes, absolute boundary speed C is 3600/S, i.e. C=3600/S. It is possible to calculate the absolute boundary speed C, even if crystals have a rectangular sections or a semicircular sections.

[Embodiment 3]

The Inventors of the present invention investigated the relationship between the speed E of raising temperature in the initial stage and the speed A of lowering temperature in the repeating stages, and the relationship between the speed F of lowering temperature in the last stage and the speed B of lowering temperature in the repeating stages. As a result, it is known that the residual stress is effectively reduced regardless of the various relationships according to the speeds therebetween. It becomes, however, clear that the relationship satisfying E<A and B<F is more effective. In this case, a simple relationship among the speeds is established, i.e., E<A<C<B<F.

[Embodiment 4]

Figure 3A:
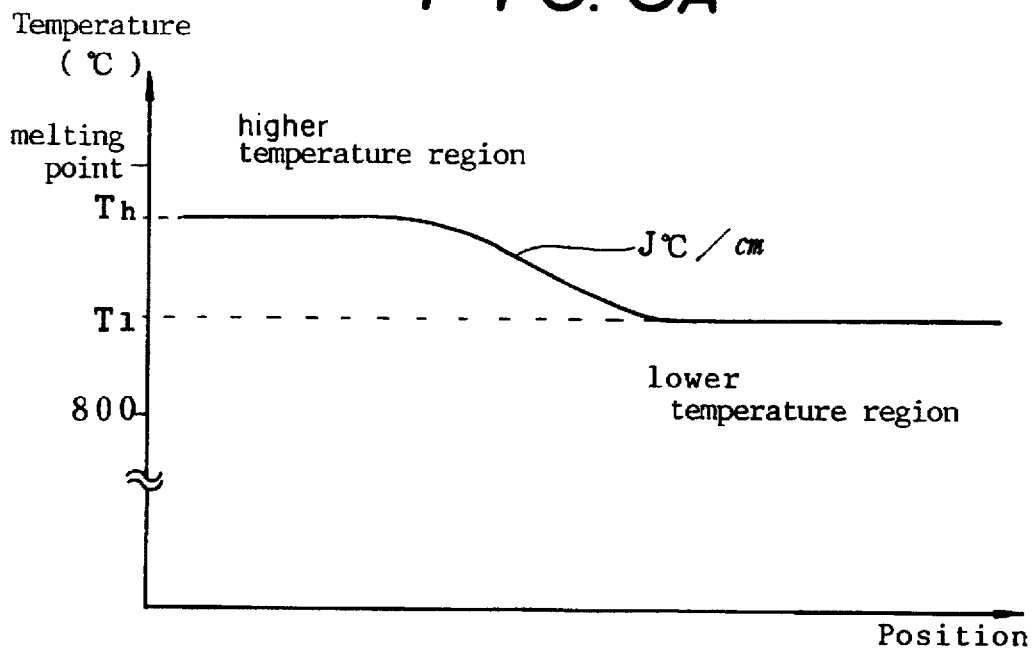
FIG. 3A is a graph showing the temperature contribution in an axial direction of a chamber so as to explain the heat-treatment of this invention in which a temperature gradient is formed in a chamber, a crystal is moved to the front and the rear (FIG. 3B) in the chamber provided with the temperature gradient, and the temperature of crystal is alternately heighten and lowered a plurality of times.
Figure 3B:
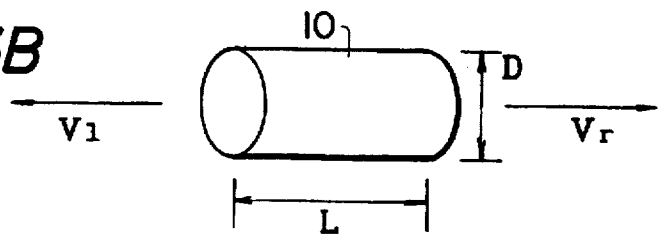

A cylindrical InP ingot having a diameter D of 50 mm$\phi$ and a length L of 100 mm was annealed with the heat-treatment of this invention. An average residual strain (distortion) ranged from $1\times10^{-5}$ to $2\times10^{-5}$. When a film was epitaxially grown on a wafer made by slicing the InP ingot, a lot of slips occurred in the film. This sample was put into a quartz tube and the quartz tube was sealed. The tube was put into a chamber, wherein the chamber was provided with a temperature gradient. The quartz tube was moved to the front and the rear (FIG. 3B) a plurality of times in the region having the temperature gradient, and whereby the temperature of the crystal was alternately raised and lowered. The abscissa does not show the time but the distance in FIG. 3A. The ordinate shows the temperature. In FIG. 3A, the temperature in the higher part of the chamber gives the upper limit temperature $T_h$, and the temperature in the lower part of the chamber determines the lower limit temperature $T_l$.

$T_h$=950° C. and $T_l$=850° C. in this embodiment. A length of the transition region having the temperature gradient is 33 mm. The temperature gradient J is 3° C./mm. If the length of the region for moving the tube, i.e. amplitude, is determined, it is possible to associate the speeds of moving the quartz tube to the front and the rear with the speeds of lowering and raising temperature. The amplitude should be longer than the sum of the length of the crystal and the length of the transition region. Speed of moving the tube in the left direction, i.e. to the higher temperature side, is 20 mm/H, i.e. $V_l$=20 mm/H. Speed of moving the tube in the right direction, i.e. to the lower temperature side, is $V_r$=70 mm/H. When an amplitude is 140 mm, speed of raising temperature is 14° C./H, i.e. A=14° C./H, and speed of lowering temperature is 50° C./H, i.e. B=50 ° C./H. Such a reciprocating annealing was repeated eight times, i.e. n=8. The residual strain of the ingot was reduced to $0.2\times10^{-5}$ to $0.5\times10^{-5}$, which is one-fifth to one-fourth of the residual strain in the initial ingot. Slips were completely excluded. It is verified that this heat-treatment is very effective to prevent the crystal from the generation of slips.

[Comparison Example 4]

An InP ingot as a sample, having the same sizes, i.e. length L=100 mm, diameter D=50 mm $\phi$, was processed by the heat-treatment in the same devices. The heat-treatment was carried out only once, i.e. n=1. The residual strain was decreased to $0.8\times10^{-5}$ to $1\times10^{-5}$. This result was, however, insufficient, and slips occurred at the time of the epitaxial growth.

[Comparison Example 5]

An InP ingot as a sample, having the same sizes, i.e. L=100 mm, D=50 mm$\phi$, was annealed with by the heat-treatment in the same devices. Reciprocating motion of the heat-treatment was carried out eight times, i.e. n=8. Speed of moving the tube in the left direction was fixed to be 70 mm/H, and the speed in the right direction was fixed to be 20 mm/H. Hence, the speed of lowering temperature is smaller than that of raising temperature. As a result, the residual strain was increased to $3\times10^{-5}$ to $4\times10^{-5}$.

[Comparison Example 6]

An InP ingot as a sample, having the same sizes, i.e. L=100 mm, D=50 mm$\phi$, was dealt with by the heat-treatment in the same devices. The upper limit temperature $T_h$ was 800° C., and the lower limit temperature $T_l$ was 700° C. Cracks occurred in the crystal even if n=1.

[Comparison Example 7]

A GaAs ingot was dealt with by the heat-treatment in a chamber. A diameter D of the ingot was 100 mm$\phi$, i.e. D=100 mm$\phi$, and a length L of the ingot was 100 mm, i.e. L=100 mm. The ratio L/D was 1. As shown in FIG. 1, the temperature of the chamber as a whole was changed by reciprocating in the range between $T_h$ (=1100° C.) and $T_l$ (=1000° C. ). The residual strain came to be $1\times10^{-5}$ to $3\times10^{-5}$, although n=5. This was an insufficient result. The reason is that there is little difference of the effects of the heat-treatment between an outside and an inside of the ingot, because the ratio (L/D) of the sample crystal is only 1, which was so small. One of the most innovative ideas of this invention is to reduce the residual stress by utilizing the complementary delays of the change of temperature between the outside and the inside of the crystal. In this example, the ratio (L/D) of the crystal is not enough to cause a big difference of the temperature between the center and the periphery of the crystal. An input and an output of the heat through the end surfaces of the crystal is so great that it is difficult to cause the delays of the temperature changes therebetween.

[Embodiment 5]

Figure 4:
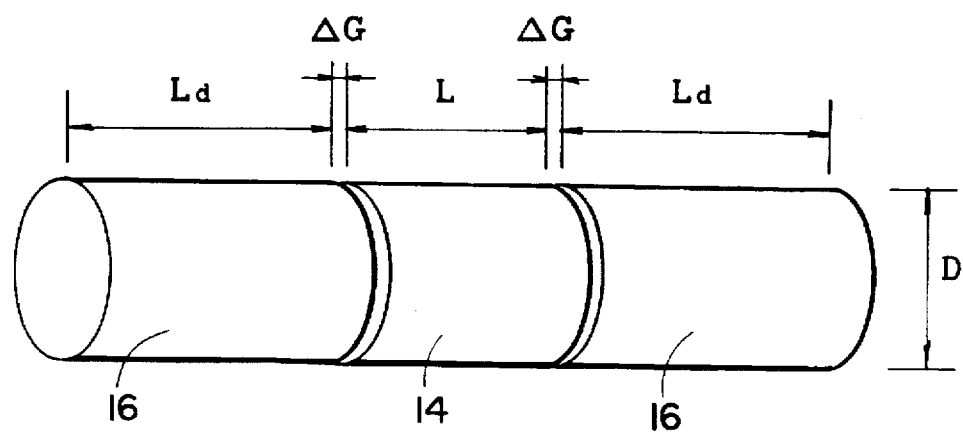
FIG. 4 is a perspective view showing the condition where other materials are placed near the front and the rear of the crystal in order to give a short crystal the temperature difference between an inside and an outside of the crystal.
Figure 5:
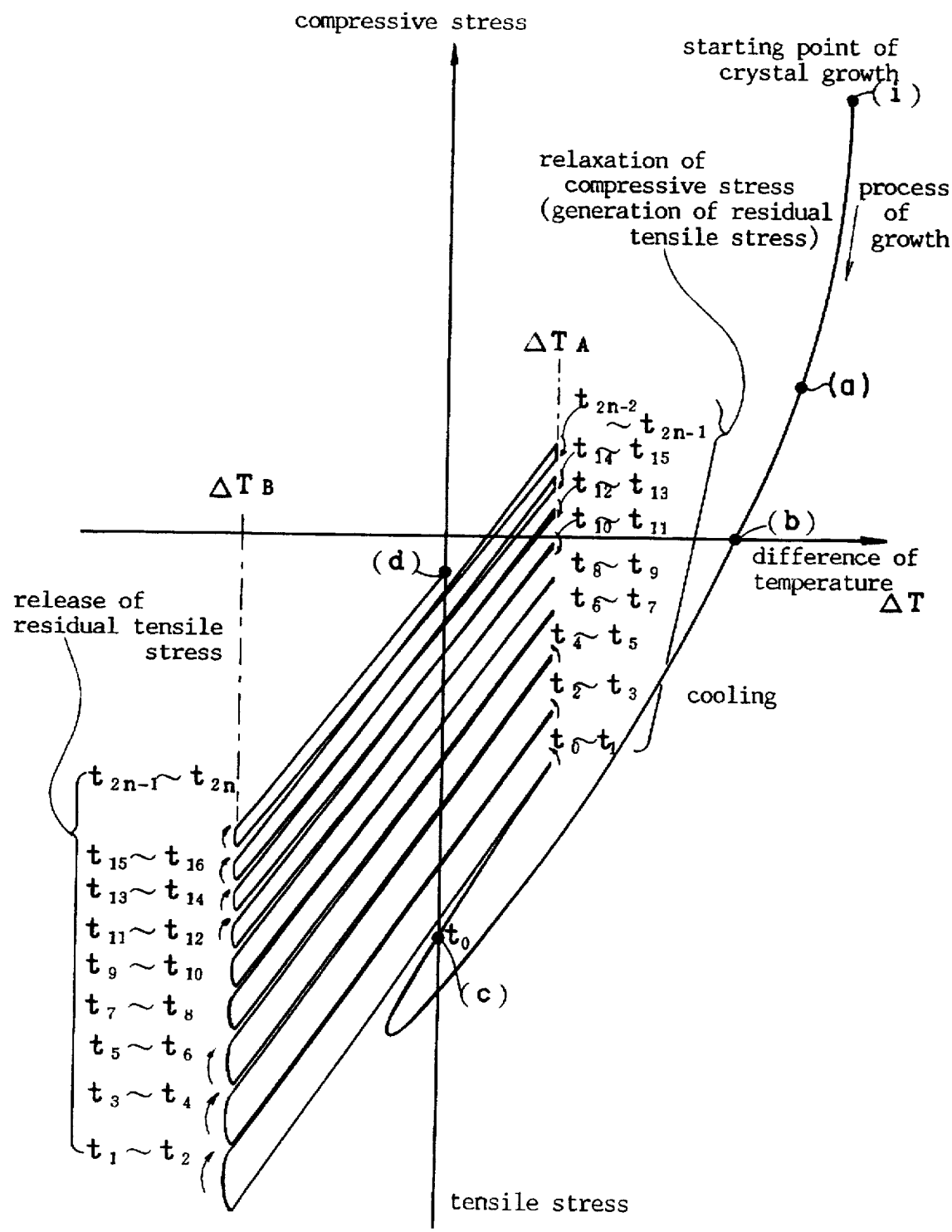

As the above embodiments, a GaAs crystal having a diameter D of 100 mm$\phi$ and a length L of 100 mm was annealed. Being sandwiched between two dummies 16 made by opaque quartz, the GaAs crystal 14 was put into a quartz tube. The tube is sealed. This sandwiching structure prevents the heat from coming and going at the end surfaces of the crystal. It is preferable that the dummies have the same diameter as the sample of the crystal. Further, a proper length were needed. Hence, both the dummies, which are shaped like quartz columns, and had the same lengths ($L_d$=100 mm), and the same diameters (D=100 mm$\phi$). A gap $\Delta$ G between the dummy and the crystal was 2 mm, i.e. $\Delta$ G=2 mm, as shown in FIG. 4. The temperature distribution shown in FIG. 3 was given to the sample. $T_h$=1100° C., and $T_l$=1000° C. The same parameters as Embodiment 1 were chosen. The crystal was annealed with by the heat-treatment for five times, i.e. n=5. The residual strain was reduced to 0.6×10⁻⁵ to 0.9×10⁻⁵. When the ingot was sliced into wafers, and a film was epitaxially grown on the wafer, no slips were generated. A suitable gap Δ G should range from 0 to 30 mm. There is no problem that the dummies are in contact with the crystal, i.e. Δ G=0. If the crystal comes in touch with the dummies at the start, some of the gap Δ G therebetween occurs, because the crystal is expanded and shrunk repeatedly. If the interval Δ G is so large, it is infeasible to cover the end surfaces of the crystal effectively.

[Comparison Example 8]

The conditions were mostly the same as the embodiment 5 except for the gap Δ G. Here, each of the gaps between the sample and the quartz columns is 40 mm, i.e. Δ G=40 mm. The same heat-treatment was carried out. The residual strain becomes 1×10⁻⁵ to 3×10⁻⁵. The reduction of the residual strain is, however, insufficient.

What I claim is:

1. A heat-treatment method for heat treating groups III–V compound semiconductor materials, said method comprising the steps of:

sealing a crystal of groups III–V compound semiconductors in a tube;

placing the tube in a chamber with heaters;

heating the crystal from room temperature to an upper limit temperature $T_h$;

cooling the crystal from the upper limit temperature $T_h$ to a lower limit temperature $T_1$, said cooling being conducted so that the crystal is change from the upper limit temperature $T_h$ to the lower limit temperature $T_1$ at a falling speed B;

repeatedly heating and cooling the crystal between the lower limit temperature $T_1$ and the upper limit temperature $T_h$ in an alternating manner more than twice, said repeated heating step comprising heating the crystal from the lower limit temperature $T_1$ to the upper limit temperature $T_h$ at a rising speed A, and said repeated cooling step comprising cooling the crystal from the upper limit temperature $T_h$ to the lower limit temperature $T_1$ at the falling speed B; and cooling the crystal from the upper limit temperature $T_h$ to room temperature;

wherein the upper limit temperature $T_h$ is less than a melting point of the crystal but more than 800° C., the lower limit temperature $T_1$ is less than the upper limit temperature $T_h$ but more than 800° C., the chamber has a temperature that is uniformly changed in a range between the upper limit temperature $T_h$ and the lower limit temperature $T_1$, and the falling speed B is higher than the rising speed A.

2. A heat-treatment method as claimed in claim 1, wherein the crystal is a GaAs single crystal with an impurity concentration less than $10^{18}$ cm⁻³, the rising speed A temperature is less than 4600 D⁻² (° C./H), and the falling speed B of temperature is more than 4600 D⁻² (° C./H), where D (cm) is a diameter of the GaAs crystal.

3. A heat-treatment method as claimed in claim 1, wherein said step of heating the crystal from room temperature to the upper limit temperature $T_h$ is conducted by raising a temperature of the chamber in its entirety at a rising rate E, wherein said repeated heating and cooling steps respectively comprise repeatedly heating and cooling the entire chamber in a range between the upper limit temperature $T_h$ and the lower limit temperature $T_1$, and wherein said step of cooling the crystal from the lower limit temperature $T_1$ to room temperature is conducted by lowering the temperature of the entire chamber at a falling rate F.

4. A heat-treatment method as claimed in claim 3, wherein the rising rate E is lower than the falling rate F.

5. A heat-treatment method for heat treating groups III–V compound semiconductor materials, said method comprising the steps of:

sealing a crystal of groups III–V compound semiconductors in a tube;

placing the tube in a chamber with heaters;

heating the crystal from room temperature to an upper limit temperature $T_h$;

providing the chamber with a temperature distribution comprising a higher temperature region maintained at an upper limit temperature $T_h$, a lower temperature region maintained at a lower limit temperature $T_1$, and a transition region with a temperature gradient coupling the higher temperature region to the lower temperature region; and reciprocating the tube more than twice between the higher temperature region and the lower temperature region through the transition region for heating the crystal at a rising speed A and for cooling the crystal at a falling speed B;

wherein the upper limit temperature $T_h$ is less than a melting point of the crystal but more than 800° C., the lower limit temperature $T_1$ is less than the upper limit temperature $T_h$ but more than 800° C., the falling speed B is determined to be greater than the rising speed A by moving the crystal from the lower temperature region to the higher temperature region at a lower speed than a speed for moving the crystal from the higher temperature region to the lower temperature region.

6. A heat-treatment method as claimed in claim 5, wherein the crystal is a GaAs single crystal with an impurity concentration of less than $10^{18}$ cm⁻³, wherein the rising speed A is less than 4600 D⁻² (° C./H), wherein the falling speed B is more than 4600 D⁻² (° C./H), and wherein D (cm) is a diameter of the GaAs crystal.

7. A heat-treatment method as claimed in claim 5, wherein a temperature of the transition temperature region changes continuously across the transition temperature region from the higher temperature region to the lower temperature region, and wherein the method further comprises a step of cooling the crystal to room temperature by cooling the chamber in its entirety.

8. A heat-treatment method as claimed in claim 5, wherein said method further comprises positioning the tube containing the crystal at an initial position corresponding to the higher temperature region prior to being heated to the upper limit temperature $T_h$, heating the crystal from room temperature to the upper limit temperature $T_h$ at the initial position, and initiating said reciprocating step by moving the tube to the lower temperature region to cool the crystal to $T_1$.

9. A heat-treatment method as claimed in claim 5, wherein said method further comprises positioning the tube containing the crystal at an initial position corresponding to the higher temperature region prior to being heated to the upper limit temperature $T_h$, heating the crystal from room temperature to $t_1$ at the initial position, and initiating said reciprocating step by moving the tube to the higher temperature region.

10. A heat-treatment method as claimed in claim 5, wherein said step of heating the crystal from room temperature to an upper limit temperature $T_h$ is conducted at a rising rate E, wherein said method further comprises cooling the crystal from the upper limit temperature $T_h$ to room temperature at a falling rate F, and wherein the rising rate E is lower than the falling rate F.

11. A heat-treatment method for heat treating groups III–V compound semiconductor materials, said method comprising the steps of:

preparing two dummies, both of the dummies having an end surface area substantially identical with an end surface of a crystal to be treated;

sandwiching the crystal between the dummies to define gaps between the crystal and both of the dummies, both of the gaps ranging from 0 to 30 mm;

sealing the crystal with the two dummies in a tube;

placing the tube in a chamber with heaters;

heating the crystal with the dummies from room temperature to an upper limit temperature $T_h$;

cooling the crystal with the dummies from the upper limit temperature $T_h$ to a lower limit temperature $T_1$, said cooling being conducted so that the crystal is change from the upper limit temperature $T_h$ to the lower limit temperature $T_1$ at a falling speed B; and repeatedly heating and cooling the crystal in the chamber between the lower limit temperature $T_1$ and the upper limit temperature $T_h$ in an alternating manner more than twice, said repeated heating step comprising heating the crystal from the lower limit temperature $T_1$ to the upper limit temperature $T_h$ at a rising speed A, and said repeated cooling step comprising cooling the crystal from the upper limit temperature $T_h$ to the lower limit temperature $T_1$ at the falling speed B;

wherein the upper limit temperature $T_h$ is less than a melting point of the crystal but more than 800° C., the lower limit temperature $T_1$ is less than the upper limit temperature $T_h$ but more than 800° C., the chamber has a temperature that is uniformly maintained in a range between the upper limit temperature $T_h$ and the lower limit temperature $T_1$, and said steps of repeatedly heating and cooling are carried out in a state where the falling speed B is higher than the rising speed A.

12. A heat-treatment method as claimed in claim 11, wherein the crystal is a GaAs crystal with an impurity concentration of less than $10^{18}$ cm$^{-3}$, wherein the rising speed A is fixed to be less than 4600 $D^{-2}$ (° C./H), wherein the falling speed B is fixed to be more than 4600 $D^{-2}$ (° C./H), and wherein D (cm) is a diameter of the GaAs crystal.

13. A heat-treatment method for heat treating groups III–V compound semiconductor materials, said method comprising the steps of:

preparing two dummies, both of the dummies having an end surface area substantially identical with an end surface of a crystal to be treated;

sandwiching the crystal between the dummies to define gaps between the crystal and both of the dummies, both of the gaps ranging from 0 to 30 mm;

sealing the crystal with the two dummies in a quartz tube;

placing the quartz tube in a chamber with heaters;

raising a temperature of the chamber in its entirety to an upper limit temperature $T_h$;

repeatedly heating and cooling the crystal in the chamber more than twice in an alternating manner by raising and lowering the temperature of the entire chamber between the upper limit temperature $T_h$ and a lower limit temperature $T_1$, said heating step including increasing a temperature of the crystal at a rising speed A, said cooling step including decreasing the temperature of the crystal at a falling speed B; and cooling the temperature of the chamber from the lower limit temperature $T_1$ to room temperature.

14. A heat-treatment method as claimed in claim 13, wherein the crystal is a GaAs crystal with an impurity concentration of less than $10^{18}$ cm$^{-3}$, wherein the rising speed A is fixed to be less than 4600 $D^{-2}$ (° C./H), wherein the falling speed B is fixed to be more than 4600 $D^{-2}$ (° C./H), and wherein D (cm) is a diameter of the GaAs crystal.

15. A heat-treatment method for heat treating groups III–V compound semiconductor materials, said method comprising the steps of:

preparing two dummies, both of the dummies having an end surface area substantially identical with an end surface of a crystal to be treated;

sandwiching the crystal between the dummies to define gaps between the crystal and both of the dummies, both of the gaps ranging from 0 to 30 mm;

sealing the crystal in a tube with the two dummies;

placing the tube in a chamber with heaters;

providing the chamber with a temperature distribution comprising a higher temperature region maintained at an upper limit temperature $T_h$, a lower temperature region maintained at a lower limit temperature $T_1$, and a transition region changing temperature continuously from the higher temperature region to the lower temperature region; and reciprocating the tube between the higher temperature region and the lower temperature region through the transition region for heating and cooling the crystal; and repeating said step of reciprocating and thereby heating the crystal at a rising speed A and cooling the crystal at a falling speed B;

wherein the upper limit temperature $T_h$ is less than a melting point of the crystal but more than 800° C., the lower limit temperature $T_1$ ranges less than the upper limit temperature $T_h$ but more than 800° C., a speed of moving from the higher temperature region to the lower temperature region is higher than a speed of moving from the lower temperature region to the higher temperature region, and the falling speed B is higher than the rising speed A.

16. A heat-treatment method as claimed in claim 15, wherein the crystal is a GaAs crystal with an impurity concentration of less than $10^{18}$ cm$^{-3}$, wherein the rising speed A is fixed to be less than 4600 $D^{-2}$ (° C./H), wherein the falling speed B is fixed to be more than 4600 $D^{-2}$ (° C./H), and wherein D (cm) is a diameter of the GaAs crystal.

* * * * *